US012660391B2

(12) United States Patent
Chung et al.

(10) Patent No.: US 12,660,391 B2
(45) Date of Patent: Jun. 16, 2026

(54) DISPLAY MODULE HAVING CONTACT PROTRUSIONS

(71) Applicant: SAMSUNG ELECTRONICS CO., LTD., Suwon-si (KR)

(72) Inventors: Changkyu Chung, Suwon-si (KR); Sungyong Min, Suwon-si (KR); Kyungwoon Jang, Suwon-si (KR); Kwangrae Jo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 451 days.

(21) Appl. No.: 18/139,691

(22) Filed: Apr. 26, 2023

(65) Prior Publication Data

US 2023/0290919 A1     Sep. 14, 2023

Related U.S. Application Data

(63) Continuation of application No. PCT/KR2021/001394, filed on Feb. 3, 2021.

(30) Foreign Application Priority Data

Nov. 30, 2020     (KR) ........................ 10-2020-0165031

(51) Int. Cl.
H10H 20/857          (2025.01)
H10H 20/819          (2025.01)
(Continued)

(52) U.S. Cl.
CPC ........ H10H 20/857 (2025.01); H10H 20/819 (2025.01); H10W 90/00 (2026.01); H10H 20/0364 (2025.01)

(58) Field of Classification Search
CPC ..... H10H 20/857; H01L 25/167; H01L 21/52; G09G 2330/08
(Continued)

(56) References Cited

U.S. PATENT DOCUMENTS 5,477,087  A  *  12/1995  Kawakita ................ H01L 24/12
                                                        257/737
10,971,058  B1 *   4/2021  Cheng ...................... G09G 3/32
(Continued)

FOREIGN PATENT DOCUMENTS

JP            2833326 B2     12/1998
JP            3952375 B2      8/2007
(Continued)

OTHER PUBLICATIONS

International Search Report dated Aug. 26, 2021, issued by the International Searching Authority in International Application No. PCT/KR2021/001394 (PCT/ISA/210).
(Continued)

*Primary Examiner* — Eliseo Ramos Feliciano
*Assistant Examiner* — Mikka Liu
(74) *Attorney, Agent, or Firm* — Sughrue Mion, PLLC

(57) ABSTRACT

A display module includes a substrate, a plurality of substrate electrode pads provided on the substrate, and a plurality of micro light-emitting diodes (LEDs) connected to the plurality of substrate electrode pads, where each of the plurality of substrate electrode pads includes a first region in which a plurality of contact protrusions are formed, and a second region configured to be connected with a repair micro LED.

13 Claims, 24 Drawing Sheets

(51) Int. Cl.
  *H10W 90/00* (2026.01)
  *H10H 20/01* (2025.01)
(58) Field of Classification Search
  USPC ........................................ 257/79, 88–89, 99
  See application file for complete search history.

(56) References Cited

U.S. PATENT DOCUMENTS

| | | | |
|---|---|---|---|
| 11,063,175 B2 | 7/2021 | Takeya et al. | |
| 11,244,932 B2 | 2/2022 | Kwag et al. | |
| 11,404,403 B2 | 8/2022 | Chung et al. | |
| 2008/0217629 A1* | 9/2008 | Lee | H10H 29/14 |
| | | | 257/E25.02 |
| 2020/0152721 A1 | 5/2020 | Chung et al. | |
| 2020/0243739 A1 | 7/2020 | Fukaya et al. | |
| 2020/0313035 A1 | 10/2020 | Lee et al. | |
| 2020/0328196 A1 | 10/2020 | Han et al. | |
| 2021/0119098 A1* | 4/2021 | Kajiyama | H01L 21/50 |
| 2022/0059511 A1* | 2/2022 | Lin | H01L 25/0753 |
| 2022/0375407 A1* | 11/2022 | Wu | H01L 25/0756 |

FOREIGN PATENT DOCUMENTS

| | | | |
|---|---|---|---|
| JP | 2019-79985 | A | 5/2019 |
| JP | 2020-4939 | A | 1/2020 |
| KR | 10-2013-0044717 | A | 5/2013 |
| KR | 10-2019-0014480 | A | 2/2019 |
| KR | 10-2020-0052044 | A | 5/2020 |
| KR | 10-2020-0054747 | A | 5/2020 |
| KR | 10-2020-0114077 | A | 10/2020 |
| KR | 10-2020-0119581 | A | 10/2020 |

OTHER PUBLICATIONS

Written Opinion dated Aug. 26, 2021, issued by the International Searching Authority in International Application No. PCT/KR2021/001394 (PCT/ISA/237).

Communication dated Feb. 14, 2025, issued by the Korean Intellectual Property Office in Korean Application No. 10-2020-0165031.

* cited by examiner

FIG. 3

DISPLAY MODULE HAVING CONTACT PROTRUSIONS

CROSS-REFERENCE TO RELATED APPLICATION(S)

This application is a bypass continuation of International Application No. PCT/KR2021/001394, filed on Feb. 3, 2021, in the Korean Intellectual Property Receiving Office, which is based on and claims priority to Korean Patent Application No. 10-2020-0165031, filed on Nov. 30, 2020, in the Korean Intellectual Property Office, the disclosures of which are incorporated by reference herein in their entireties.

BACKGROUND

1. Field

The disclosure relates to a display module and a method for manufacturing the same, and more particularly, to a display module including substrate electrode pads that can stabilize connection between the substrate electrode pads and chip electrode pads of micro LEDs, and a method for manufacturing the same.

2. Description of Related Art

A self-emission display element displays an image without a color filter and a backlight, and as a self-emission display element, a light-emitting diode (LED) inorganic self-emission element that emits light by itself may be used.

A display module expresses various colors by operating in pixel or sub-pixel units consisting of LED inorganic self-emission elements, and the operation of each pixel or sub-pixel is controlled by a thin film transistor (TFT). A TFT substrate is a flexible substrate on which a TFT circuit is formed, such as a glass substrate, or a plastic substrate. A plurality of TFTs connected to a TFT circuit are mounted on a TFT substrate.

SUMMARY

Provided is a display module including substrate electrode pads that may minimize an unlit error of micro light-emitting diodes (LEDs) and stabilize connection between the substrate electrode pads and chip electrode pads of micro LEDs, and a method for manufacturing the same.

Further, provided is a display module including substrate electrode pads including a redundancy area to which a repair micro LED may be connected, and a method for manufacturing the same.

Additional aspects will be set forth in part in the description which follows and, in part, will be apparent from the description, or may be learned by practice of the presented embodiments.

According to an aspect of the disclosure, a display module includes a substrate, a plurality of substrate electrode pads provided on the substrate, and a plurality of micro LEDs connected to the plurality of substrate electrode pads, where each of the plurality of substrate electrode pads includes a first region in which a plurality of contact protrusions are formed, and a second region configured to be connected with a repair micro LED.

The plurality of substrate electrode pads may include at least four substrate electrode pads, and the at least four substrate electrode pads may include a first substrate electrode pad, a second substrate electrode pad, and a third substrate electrode pad connected to a power electrode, and a fourth substrate electrode pad connected to a common electrode.

The first region of the fourth substrate electrode pad and the second region of the fourth substrate electrode pad may be alternatingly arranged.

Each of the plurality of micro LEDs may include a pair of LED electrode pads, and each micro LED of the plurality of micro LEDs may respectively correspond to a pair of substrate electrode pads of the plurality of substrate electrode pads.

The plurality of contact protrusions may be evenly distributed inside the first region.

An elastic core may be provided on inner sides of the plurality of contact protrusions.

The elastic core may include a conductive material or a non-conductive material.

The plurality of contact protrusions may have hemisphere shapes, tetrahedrons, circular columns, or oval column shapes.

The plurality of contact protrusions may have rectilinear shapes with a specific length and the plurality of contact protrusions may be provided in parallel at a predetermined interval.

The plurality of substrate electrode pads may include at least one of Ti/Al/Ti, Mo/Al/Mo, Cu/Ni/Au, Ni, Cu, or Indium.

The display module may include a capping layer provided on each substrate electrode pad of the plurality of substrate electrode pads and configured to prevent oxidation of the plurality of substrate electrode pads, where the capping layer may include at least one of Au, Indium Tin Oxide (ITO), Indium Zinc Oxide (IZO), or Indium, A surface of the second region may include a plane.

A pair of chip electrode pads may be respectively connected to a pair of corresponding substrate electrode pads, and each chip electrode pad may include at least one of Ni/Au, Ti/Au, or Cu(Ni) Pillar/SnAg Bump.

According to an aspect of the disclosure, a method of manufacturing a display module includes forming a plurality of elastic cores to be evenly arranged on predetermined areas on a substrate, forming a plurality of substrate electrode pads, forming a plurality of contact protrusions by covering the plurality of elastic cores, forming a non-conductive adhesion layer covering the substrate and the plurality of substrate electrode pads, transferring a plurality of micro LEDs on the non-conductive adhesion layer, and thermo-compressing the plurality of micro LEDs such that chip electrode pads included in each of the plurality of micro LEDs are connected to the plurality of contact protrusions of a corresponding substrate electrode pad.

The forming of the plurality of substrate electrode pads may include forming a first region configured to be contacted by at least one micro LED of the plurality of micro LED, and forming a second region extending from the first region and contacting a repair micro LED, where the first region is formed at a position covering the plurality of elastic cores.

BRIEF DESCRIPTION OF DRAWINGS

The above and other aspects, features, and advantages of certain embodiments of the present disclosure will be more apparent from the following description taken in conjunction with the accompanying drawings, in which:

FIG. 3 is a cross-sectional view illustrating a part of a display module according to an embodiment of the disclosure;

DETAILED DESCRIPTION

Figure 1:
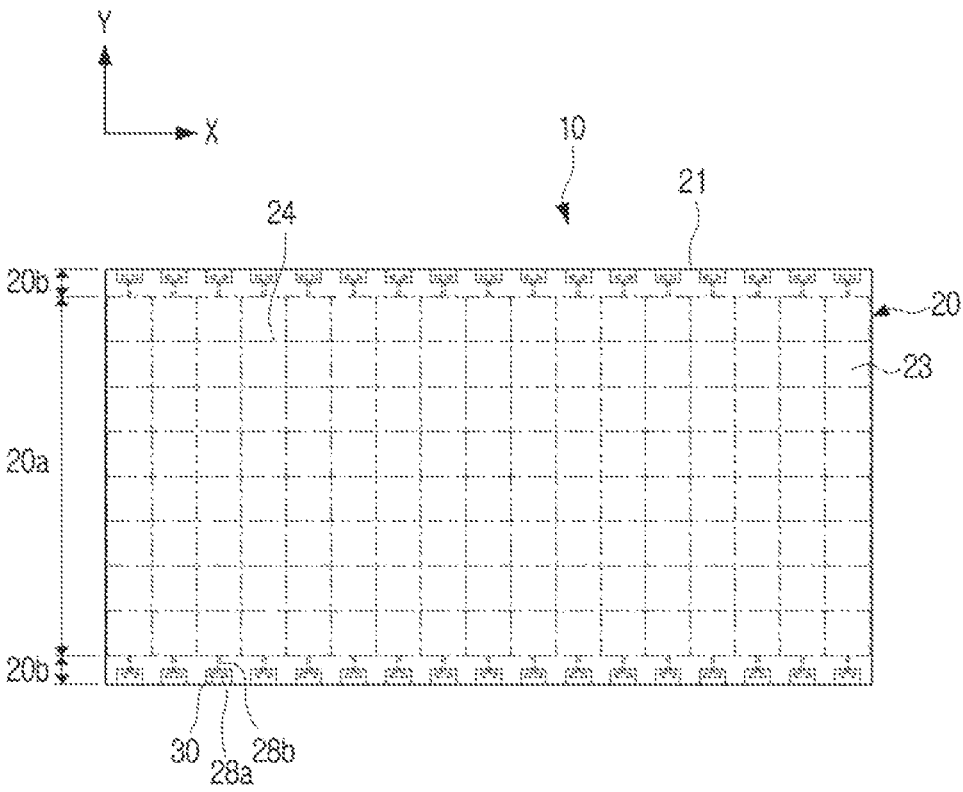
FIG. 1 is a diagram illustrating a display module according to an embodiment of the disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms. It is to be understood that singular forms include plural referents unless the context clearly dictates otherwise. The terms including technical or scientific terms used in the disclosure may have the same meanings as generally understood by those skilled in the art.

Also, in the disclosure, terms including ordinal numbers such as "first" and "second" may be used for describing various components, but these components are not limited by the aforementioned terms. The aforementioned terms are used only for the purpose of distinguishing one component from another component.

In addition, in the disclosure, terms such as "include" or "have" should be construed as designating that there are such characteristics, numbers, steps, operations, elements, components, or a combination thereof described in the specification, but not as excluding in advance the existence or possibility of adding one or more of other characteristics, numbers, steps, operations, elements, components, or a combination thereof. Further, the description in the disclosure that an element is "coupled with/to" or "connected to" another element should be interpreted to mean that the one element may be directly coupled with/to or connected to the another element, but still another element may exist between the elements. In contrast, the description that one element is "directly coupled" or "directly connected" to another element can be interpreted to mean that still another element does not exist between the one element and the another element.

Also, in the disclosure, the expression 'identical' not only means that some features perfectly coincide, but also means that the features include a difference in consideration of a machining error range.

Other than the above, in describing the disclosure, in case it is determined that detailed explanation of related known functions or features may unnecessarily confuse the gist of the disclosure, the detailed explanation will be abridged or omitted.

A display module may be a display panel including micro light emitting diodes (LEDs) (or μLEDs). A display module is one of flat display panels, and may include a plurality of inorganic LEDs, each of which is in a size of smaller than or equal to 100 μm, and thus a micro LED display module provides better contrast, response time, and energy efficiency compared to a liquid crystal display (LCD) panel which needs a backlight.

Both an organic LED (OLED) and a micro LED, which is an inorganic light emitting element, have good energy efficiency, but a micro LED has better brightness and light emitting efficiency, and a longer lifespan than an OLED. A micro LED may be a semiconductor chip that may emit light by itself when power is supplied. A micro LED has a fast reaction speed, low power consumption, and high luminance. For example, a micro LED has higher efficiency in converting electrons to photons compared to a related art LCD or an OLED. That is, a micro LED has higher "brightness per watt" compared to a related art LCD or an OLED display. Accordingly, a micro LED may exert the same brightness even with approximately half the energy compared to a related art LED (the width, length, and height respectively exceed 100 μm) or an OLED. In addition, a micro LED may implement a high resolution, and superior colors, contrast, and brightness, and may thus express colors in a wide range precisely, and may implement a clear screen even in the outdoors where sunlight is bright. Also, a micro LED is strong against a burn-in phenomenon and emits a small amount of heat, and thus a long lifespan is guaranteed without deformation. Also, a micro LED may have a flip chip structure where anode and cathode electrodes are formed on the same first surface, and a light emitting surface is formed on the second surface located on the opposite side of the first surface on which the electrodes are formed.

A thin film transistor (TFT) layer on which a TFT circuit is formed may be arranged on the front surface of a substrate, and a power supply circuit supplying power to the TFT circuit and a data operating driver, a gate operating driver, and a timing controller controlling each operating driver may be arranged on the rear surface. A plurality of pixels arranged on the TFT layer may be driven by the TFT circuit.

A glass substrate, a substrate based on a synthetic resin having a flexible material (e.g., polyimide (PI), polyethylene terephthalate (PET), polyethersulfone (PES), polyethylene naphthalate (PEN), polycarbonate (PC), etc.), or a ceramic substrate may be used.

On the front surface of the substrate, a TFT layer on which a TFT circuit is formed may be arranged, and a circuit may not be arranged on the rear surface of the substrate. The TFT layer may be formed as an integrated body on the substrate, or may be manufactured in the form of a separate film, and attached on one surface of the glass substrate.

The front surface of the substrate may be divided into an active area and an inactive area. The active area may correspond to the area occupied by the TFT layer on the front surface of the substrate, and the inactive area may be the area excluding the area occupied by the TFT layer on the front surface of the substrate.

The edge area of the substrate may be the outermost area of the glass substrate. Also, the edge area of the substrate may be the remaining area excluding the area where the circuit of the substrate is formed. Further, the edge area of the substrate may include a part of the front surface of the substrate adjacent to the side surface of the substrate, and a part of the rear surface of the substrate adjacent to the side surface of the substrate. The substrate may be formed as a quadrangle type. Specifically, the substrate may be formed in various shapes such as a rectangle, a square, a circle, an oval, etc. The edge area of the substrate may include at least one side among the four sides of the glass substrate.

The TFTs constituting the TFT layer (or the backplane) are not limited to a specific structure or type. For example, the TFTs may also be implemented as an oxide TFT and an Si TFT (poly silicon, a-silicon), an organic TFT, a graphene TFT, etc., and a P-type (or an N-type) MOSFET may be manufactured in an Si wafer CMOS process and applied.

The pixel driving method of the display module may be an active matrix (AM) driving method or a passive matrix (PM) driving method. The display module may form a pattern of wirings to which each micro LED is electronically connected according to the AM driving method or the PM driving method.

The display module includes a glass substrate on which a plurality of LEDs are mounted and a side surface wiring is formed. Also, the display module may include a cross-section substrate of a bezel type which does not need electrical wiring (i.e., does not have a surface side wiring on the back surface).

The substrate included in the display module may not be limited to a TFT substrate, and the display module may include a substrate not including a TFT layer on which a TFT circuit is formed (e.g., a substrate on which only a wiring is patterned while a micro integrated circuit (IC) is separately mounted).

Such a display module may be installed and applied in a single unit on wearable devices, portable devices, handheld devices, and various kinds of electronic products or electronic components which need displays. Also, the display module may be applied as a matrix type to display devices such as monitors for personal computers, high resolution TVs and signage (or, digital signage), and electronic displays, etc. through a plurality of assembly arrangements.

Hereinafter, a display module according to an embodiment of the disclosure will be described with reference to the drawings.

Figure 2:
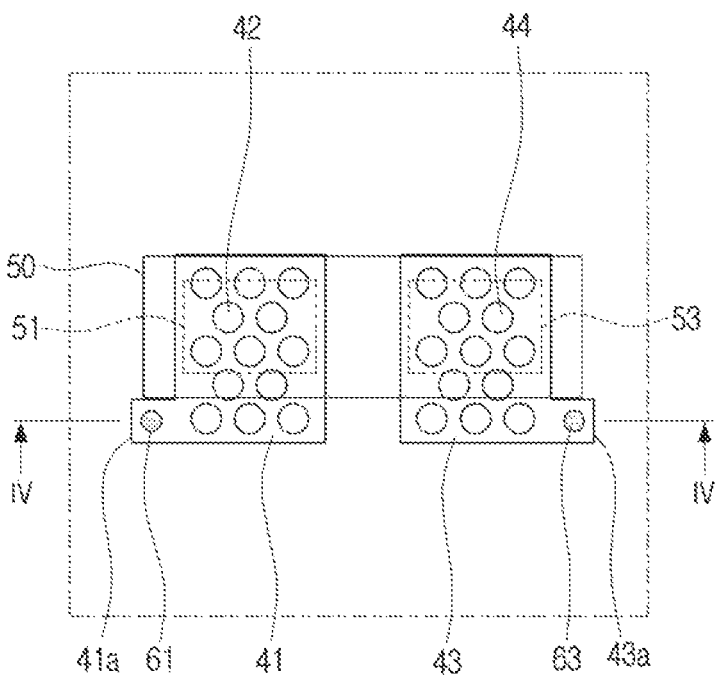
FIG. 2 is a diagram illustrating sub-pixels arranged on a TFT substrate according to an embodiment of the disclosure.
Figure 3:
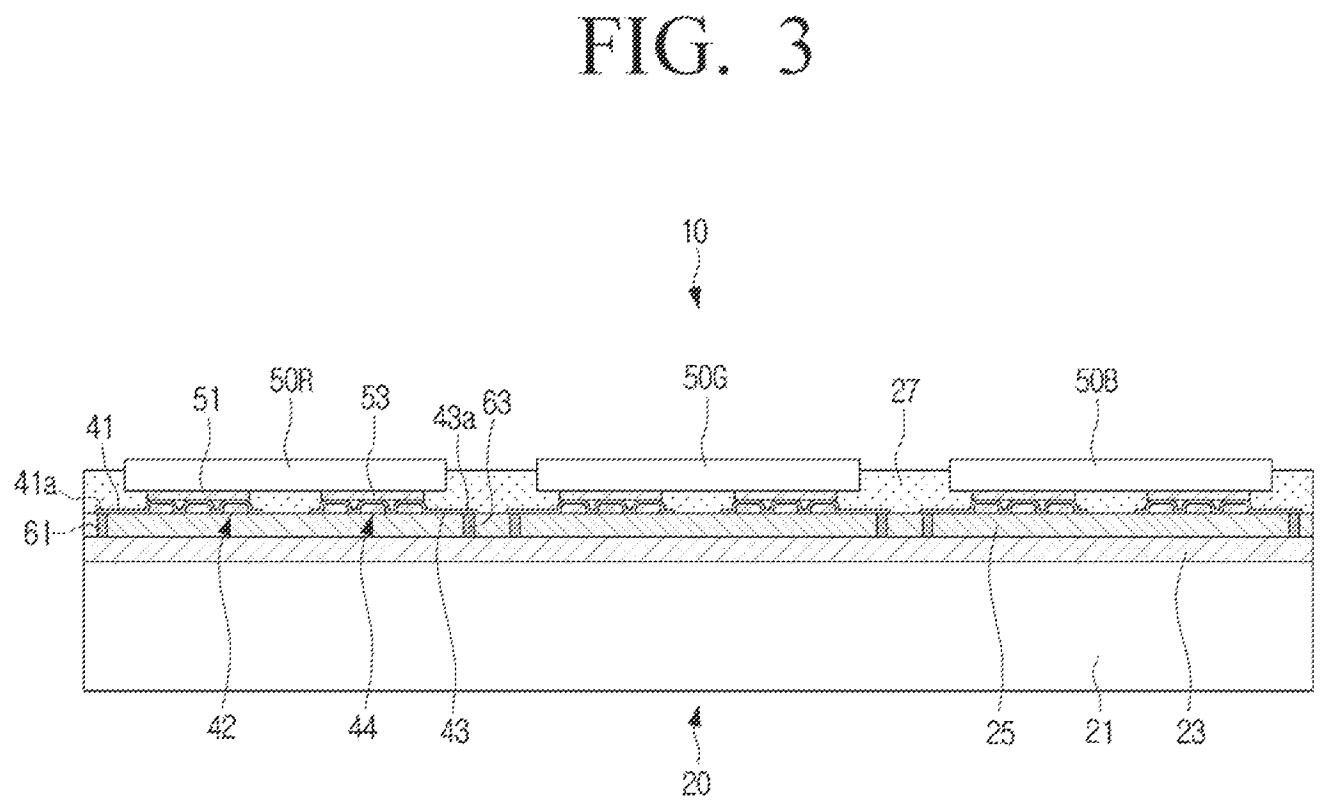
Figure 4:
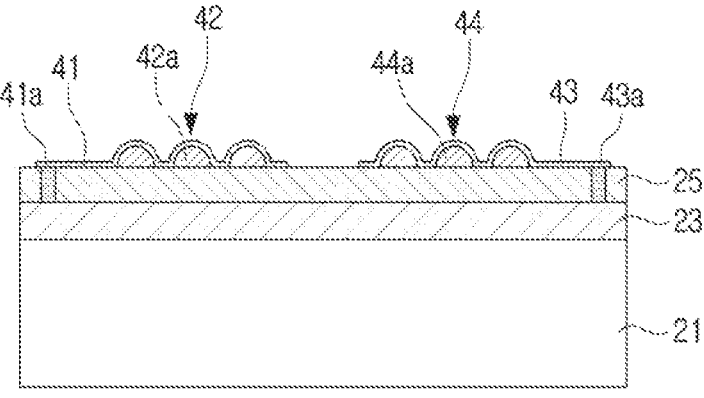
FIG. 4 is a cross-sectional view illustrated along the IV-IV line of FIG. 2 according to an embodiment of the disclosure.

FIG. 1 is a diagram illustrating a display module according to an embodiment of the disclosure. FIG. 2 is a diagram illustrating sub-pixels arranged on a TFT substrate according to an embodiment of the disclosure. FIG. 3 is a cross-sectional view illustrating a part of a display module according to an embodiment of the disclosure. FIG. 4 is a cross-sectional view illustrated along the IV-IV line of FIG. 2 according to an embodiment of the.

Referring to FIG. 1, the display module 10 according to an embodiment may include a TFT substrate 20.

The display module 10 may include a plurality of micro LEDs 50 arranged on the TFT substrate 20. The plurality of micro LEDs 50 may be sub-pixels constituting a single pixel. In the disclosure, 'a micro LED' and 'a sub-pixel' may be interchangeably used.

The TFT substrate 20 may include a glass substrate 21, a TFT layer 23 where a TFT circuit is included in the front surface of the glass substrate 21, and a plurality of side surface wirings 30 electronically connecting the TFT circuit of the TFT layer 23 and circuits arranged on the rear surface of the glass substrate 21.

As an alternative of the glass substrate 21, a substrate based on a synthetic resin having a flexible material (e.g., PI, PET, PES, PEN, PC, etc.), or a ceramic substrate may be used.

The TFT substrate 20 includes an active area 20a expressing an image, and a dummy area 20b that cannot express an image on the front surface.

The active area 20a may be partitioned into a plurality of pixel areas 24 where a plurality of pixels are respectively arranged. The plurality of pixel areas 24 may be partitioned in various forms, and as an example, they may be partitioned in the form of a matrix.

The dummy area 20b may be included in the edge area of the glass substrate 12, and a plurality of connection pads 28a may be arranged at a specific interval. The plurality of connection pads 28a may respectively be electronically connected to each sub-pixel thorough a wiring 28b.

The number of the connection pads 28a formed in the dummy area 20b may vary according to the number of pixels implemented on the glass substrate, and may also vary according to the driving method of the TFT circuit arranged in the active area 20a. For example, compared to the case of the PM driving method where the TFT circuit arranged in the active area 20a drives a plurality of pixels in a horizontal line and a vertical line, the AM driving method of individually driving each pixel may need more wirings and connection pads.

The plurality of micro LEDs 50 may include an inorganic light emitting material, and may be semiconductor chips that may emit light by themselves when power is supplied. For example, the plurality of micro LEDs 50 may have a flip chip structure where anode and cathode electrodes are formed on the same surface, and a light emitting surface is formed on the opposite side of the electrodes.

The plurality of micro LEDs 50 may have a specific thickness, and may be formed of a square of which width and length are identical, or a rectangle of which width and length are different. Such a micro LED may implement a real high dynamic range (HDR), and may provide improved luminance and expressiveness of a black color and a high contrast ratio compared to an OLED. The size of the micro LED may be smaller than or equal to 100 μm, or smaller than or equal to 30 μm.

On the display module 10, a black matrix respectively partitioning the plurality of micro LEDs 50 may be formed in an approximate grid shape on the TFT layer 23. In this case, the display module 10 may include a transparent cover layer covering the plurality of micro LEDs 50 and the black matrix for protecting the plurality of micro LEDs 50 and the black matrix together. On the outer side surface of the transparent cover layer, a touch screen panel may be arranged in lamination.

Referring to FIG. 2, the micro LEDs 50 which are sub-pixels arranged in the pixel area 24 may be electronically connected to substrate electrode pads 41, 43 arranged on the TFT substrate 20.

Referring to FIG. 3 and FIG. 4, the substrate electrode pads 41, 43 may be arranged on an insulating organic film 25 formed on the TFT layer 23 in lamination.

The substrate electrode pads 41, 43 may respectively be electronically connected with the TFT layer 23 through via hole wirings 61, 63. In this case, on one side of the substrate electrode pads 41, 43, connecting portions 41a, 43a that are respectively connected electronically with the via hole wirings 61, 63 may be formed in extension.

The substrate electrode pads 41, 43 may respectively be electronically connected with chip electrode pads 51, 53 of the micro LEDs 50. The substrate electrode pads 41, 43 may include Ti/Al/Ti, Mo/Al/Mo, Ni/Au, Indium, Ni, Cu, etc. The chip electrode pads 51, 53 electronically connected to the substrate electrode pads 41, 43 may include Ni/Au, Ti/Au, Cu(Ni) Pillar/SnAg Bump, etc.

The substrate electrode pads 41, 43 and the chip electrode pads 51, 53 may not only be electronically connected, but may also be connected with each other physically. In this case, physical connection may be formed as a part of the surface where the substrate electrode pads 41, 43 and the chip electrode pads 51, 53 contact each other and melts when the micro LEDs 50 are transferred to the TFT substrate 20, and then the micro LEDs 50 are pressurized to the side of the TFT substrate 20 by a pressurizing member while the TFT substrate 20 has been heated to a specific temperature by a heater. Also, the substrate electrode pads 41, 43 and the chip electrode pads 51, 53 may also be joined with each other by metal alloy junction (e.g., solder, Au—In junction, etc.).

The micro LEDs 50 may be fixed to the TFT substrate 20 by an adhesion layer, e.g., a non-conductive film (NCF) layer 27. At the time of thermo-compression bonding, the micro LEDs 50 may be forcibly inserted inside the NCF layer 27 laminated on the insulating organic film 25. Afterwards, as the NCF layer 27 is cured, the micro LEDs 50 may be steadfastly fixed to the TFT substrate 20.

On the surface of each of the substrate electrode pads 41, 43 electronically contacting the chip electrode pads 51, 53 of the micro LEDs 50, a plurality of contact protrusions 42, 44 may be respectively formed.

The plurality of contact protrusions 42, 44 may be arranged approximately evenly with respect to the areas of the substrate electrode pads 41, 43. This enables securing of a maximum contact area with the chip electrode pads 51, 53 even in case the micro LEDs 50 are outside a predetermined transfer location when transferred to the TFT substrate 20, and thus the factor for a connection error may be fundamentally removed.

As the plurality of contact protrusions 42, 44 are formed on the substrate electrode pads 41, 43, an inexpensive NCF is applied without using an expensive anisotropic conductive film (ACF) including a conductive ball inside for electronically connecting the substrate electrode pads 41, 43 and the chip electrode pads 51, 53 of the micro LEDs 50 with each other, and thus the manufacturing cost may be reduced noticeably.

Also, in case micro LEDs of an ultrafine size are applied to the display module, a pitch between micro LEDs adjacent to each other also becomes ultrafine. Accordingly, the interval between a pair of chip electrode pads (an anode, a cathode) including the micro LEDs also becomes very narrow. In this case, if conductive balls included in the ACF are arranged to be dense between the pair of chip electrode pads, a short error between the pair of chip electrode pads may occur, and it may become the cause of unlighting of the micro LEDs. The plurality of contact protrusions 42, 44 are not only formed only on the substrate electrode pads 41, 43, but the protrusions may also be evenly arranged with respect to the entire areas of the substrate electrode pads 41, 43. Accordingly, a short error between the pair of chip electrode pads 51, 53 of the micro LEDs that may occur when using the ACF may be fundamentally blocked.

Also, when transferring the micro LEDs, a vision alignment process may proceed for detecting the transfer location of the micro LEDs. However, for connection of the micro LEDs of a very small size, the conductive balls in the ACF should be evenly aligned, and at the same time, the density of the conductive balls should be high. In this case, light emitted from the vison alignment equipment cannot pass through the conductive balls arranged in high density, and due to this, the correct locations of the substrate electrode pads cannot be identified, and thus the procedural difficulty when transferring the micro LEDs may increase. The plurality of contact protrusions 42, 44 formed on the substrate electrode pads 41, 43 maintain density to a degree that light permeation of the vision alignment equipment is possible, and accordingly, increase of the procedural difficulty when transferring the micro LEDs may be prevented.

The plurality of contact protrusions 42, 44 may be formed in approximately hemisphere shapes as in FIG. 3 and FIG. 4. However, the shapes of the plurality of contact protrusions 42, 44 are not limited thereto, and they may also be formed in cuboid shapes, tetrahedrons, circular columns, or oval column shapes. Also, the shapes of the plurality of contact protrusions 42, 44 may be determined by the shapes of elastic cores 42a, 44a that will be described below.

On the inner side of each of the plurality of contact protrusions 42, 44, elastic cores 42a, 44a may be arranged. The elastic cores 42a, 44a may include a non-conductive or conductive material. For example, the elastic cores 42a, 44a may be any one of an elastic polymer such as polyimide (PI), metal having elasticity, or metal having both elasticity and conductivity.

The shapes of the elastic cores 42a, 44a may be deformed as they are pressurized by the micro LEDs 50 at the time of the aforementioned thermo-compression bonding. When the pressurizing force applied to the micro LEDs 50 is released, the elastic cores 42a, 44a may be restored to their original shapes by their own elastic force, and a part of the substrate electrode pads 41, 43 laminated on the elastic cores 42a, 44a adheres to the chip electrode pads 51, 53, and accordingly, electronic connection between each electrode pad 41, 43, 51, 53 may be performed securely.

The elastic cores 42a, 44a are formed on the insulating organic film 25, and they may include separate components from the insulating organic film 25. However, the disclosure is not limited thereto, and in order that a part of the insulating organic film 25 may also play the role of the elastic core, a plurality of protrusions may be formed integrally on a part of the insulating organic film 25 located on the lower side of the substrate electrode pads 41, 43. In this case, the substrate electrode pads 41, 43 may be patterned on the plurality of protrusions of the insulating organic film 25, and a plurality of contact protrusions may be formed.

Figure 5:
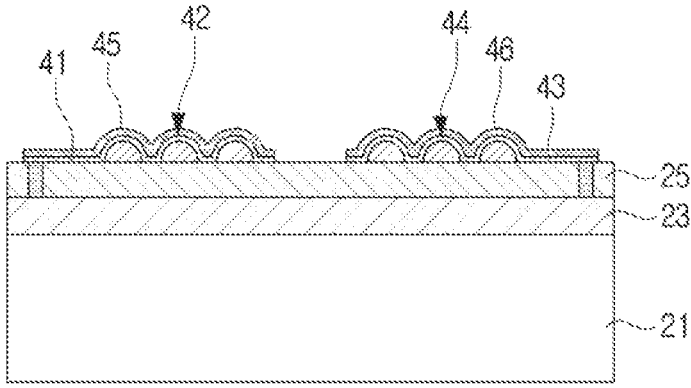
FIG. 5 is a cross-sectional view illustrating a capping layer for preventing oxidation formed on a substrate electrode pad according to an embodiment of the disclosure.

FIG. 5 is a cross-sectional view illustrating a capping layer for preventing oxidation formed on a substrate electrode pad according to an embodiment of the disclosure.

Referring to FIG. 5, for preventing oxidation of the substrate electrode pads 41, 43, capping layers 45, 46 may be formed on the substrate electrode pads 41, 43 in lamination.

The capping layers 45, 46 may have conductivity so that they may prevent oxidation of the substrate electrode pads 41, 43 and may be electronically connected with the chip electrode pads 51, 53. The capping layer 45, 46 may include, for example, an oxide such as Au or Indium Tin Oxide (ITO), Indium Zinc Oxide (IZO), etc.

Also, the capping layers 45, 46 may include Indium for metal alloy junction (Au—In junction), or a separate Indium layer may be formed in lamination.

Figure 6:
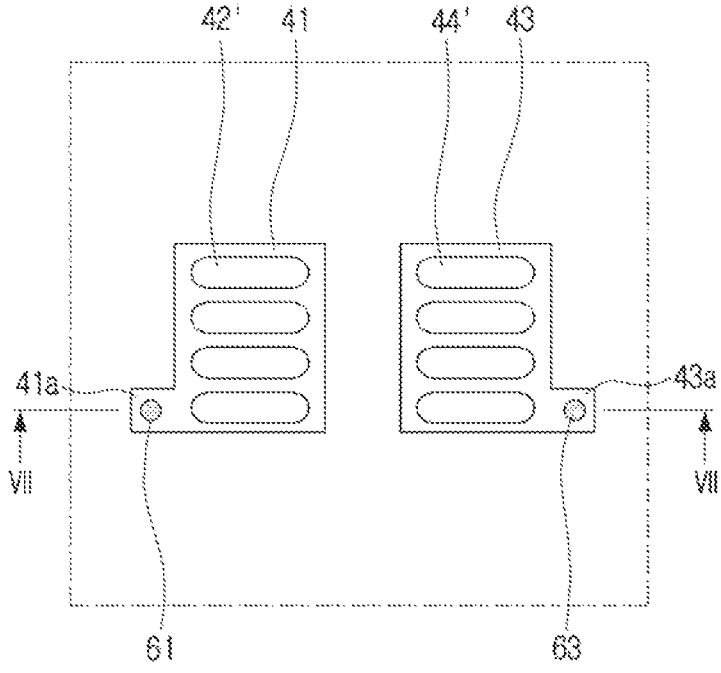
FIG. 6 is a diagram illustrating a shape of a contact protrusion formed on a substrate electrode pad according to an embodiment of the disclosure.
Figure 7:
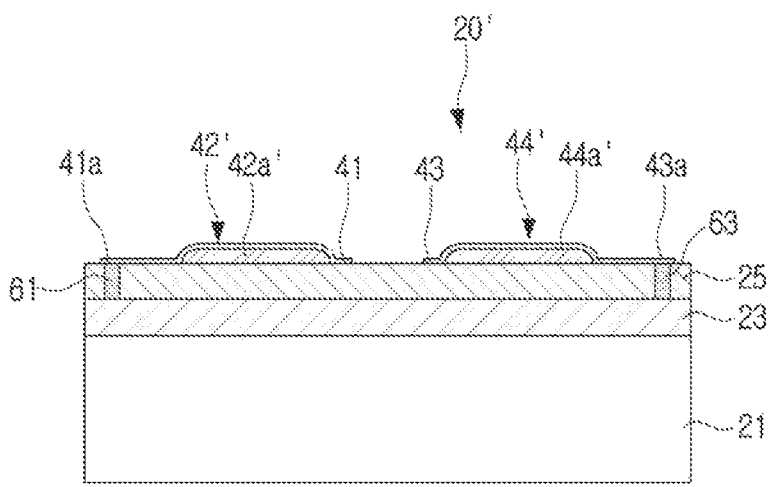
FIG. 7 is a cross-sectional view illustrated along the VII-VII line of FIG. 6 according to an embodiment of the disclosure.

FIG. 6 is a diagram illustrating a shape of a contact protrusion formed on a substrate electrode pad according to an embodiment of the disclosure. FIG. 7 is a cross-sectional view illustrated along the VII-VII line of FIG. 6 according to an embodiment of the disclosure.

Referring to FIG. 6 and FIG. 7, the plurality of contact protrusions 42', 44' formed on the substrate electrode pads 41, 43 may be formed differently from the aforementioned contact protrusions 42, 44 in hemisphere shapes. For example, the plurality of contact protrusions 42', 44' may include rectilinear shapes of which length (the horizontal direction) and width (the vertical direction) are different from each other. Referring to FIG. 6, in the plurality of contact protrusions 42', 44', the length is formed to be greater than the width.

The plurality of contact protrusions 42', 44' may be arranged approximately in parallel at a specific interval. In FIG. 6, an embodiment where the length and the width of all of the plurality of contact protrusions 42', 44' were formed to be identical is illustrated, but the disclosure is not limited thereto, and it is obviously possible that the length and the width of the plurality of contact protrusions 42', 44' are formed to be different from one another.

On the inner sides of the plurality of contact protrusions 42', 44', elastic cores 42a', 44a' may be respectively arranged. The material of the elastic cores 42a', 44a' may be identical to the material of the aforementioned elastic cores 42a, 44a.

In the disclosure, the substrate electrode pad may be formed to further include a redundancy area where a repair micro LED may be arranged so that the micro LEDs 50 transferred to the TFT substrate 20 may be repaired in case they are defective. Hereinafter, the substrate electrode pad including a redundancy area will be described with reference to FIG. 8 to FIG. 11.

Figure 8:
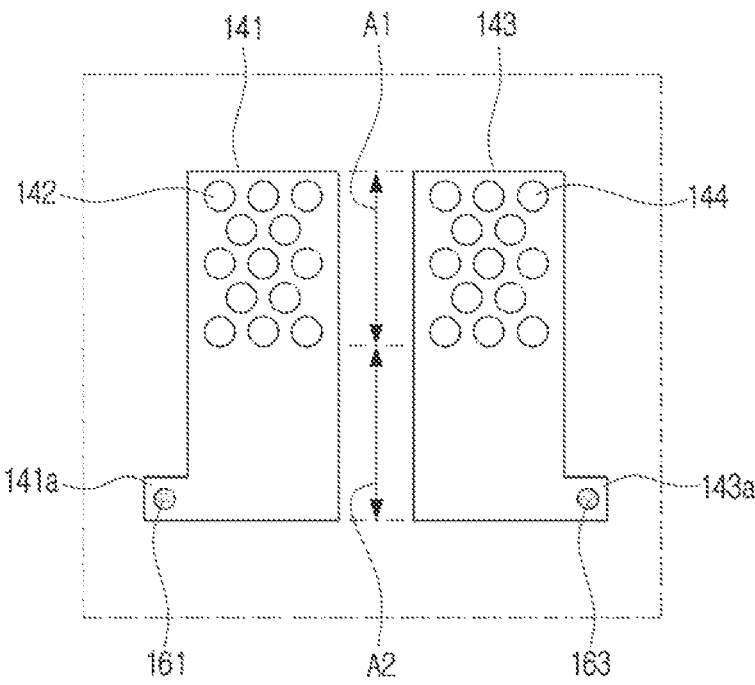
FIG. 8 is a diagram illustrating an example of a substrate electrode pad including a redundancy area to which a repair micro light-emitting diode (LED) may be electronically connected according to an embodiment of the disclosure.
Figure 9:
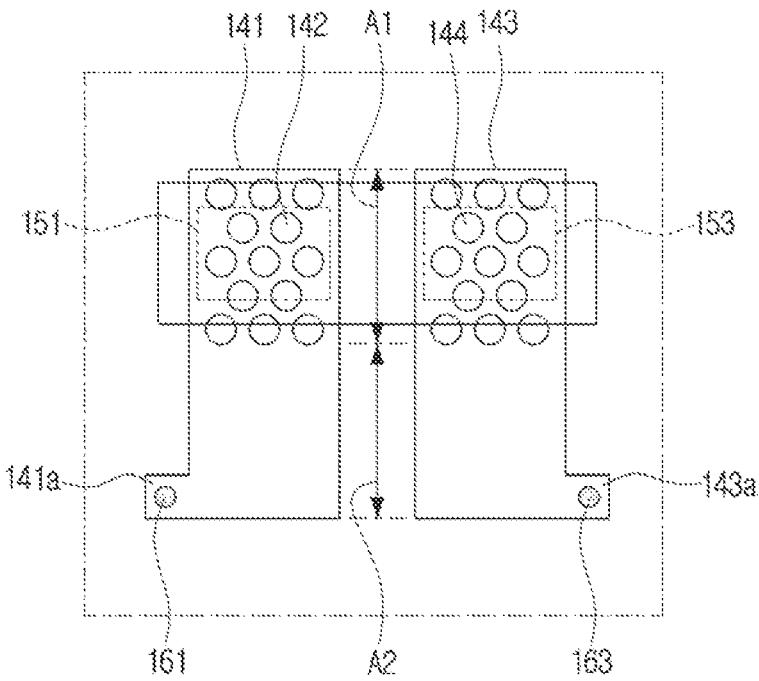
FIG. 9 is a diagram illustrating micro LEDs arranged in a main area of a substrate electrode pad according to an embodiment of the disclosure.
Figure 10:
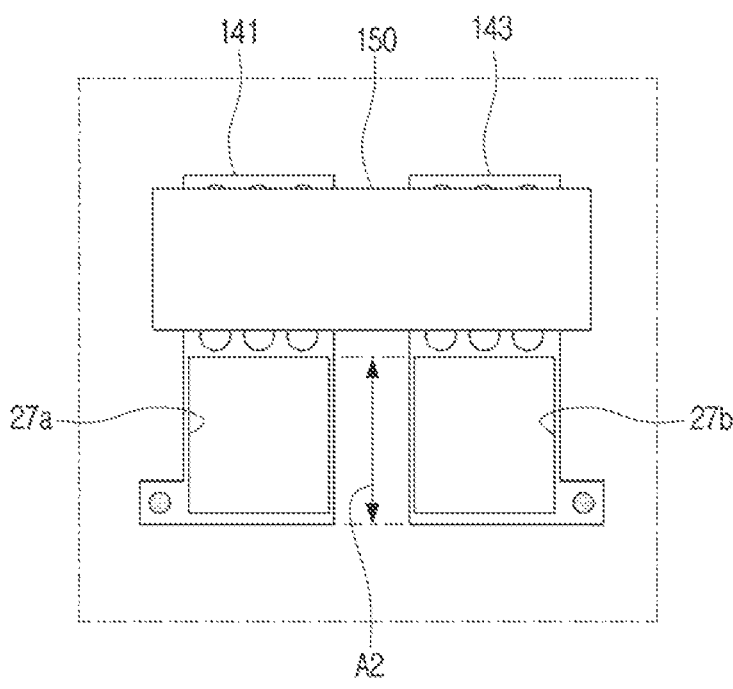
FIG. 10 is a diagram illustrating a part of a non-conductive film (NCF) layer corresponding to a redundancy area having been removed in the NCF layer covering a substrate electrode pad according to an embodiment of the disclosure.
Figure 11:
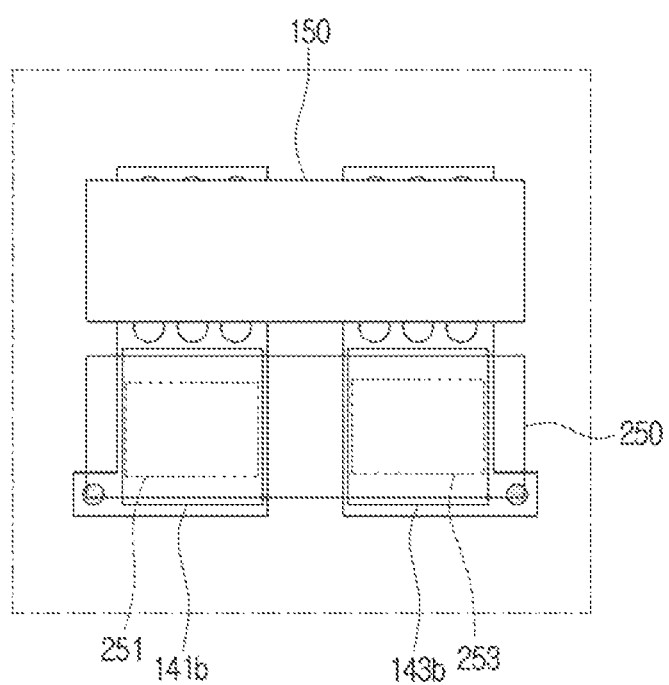
FIG. 11 is a diagram illustrating a repair micro LED connected to a redundancy area of a substrate electrode pad according to an embodiment of the disclosure.

FIG. 8 is a diagram illustrating an example of a substrate electrode pad including a redundancy area to which a repair micro light-emitting diode (LED) may be electronically connected according to an embodiment of the disclosure. FIG. 9 is a diagram illustrating micro LEDs arranged in a main area of a substrate electrode pad according to an embodiment of the disclosure. FIG. 10 is a diagram illustrating a part of a NCF layer corresponding to a redundancy area having been removed in the NCF layer covering a substrate electrode pad according to an embodiment of the disclosure. FIG. 11 is a diagram illustrating a repair micro LED connected to a redundancy area of a substrate electrode pad according to an embodiment of the disclosure.

Referring to FIG. 8 and FIG. 9, the substrate electrode pads 141, 143 may include a first region A1 to which micro LEDs 150 are electronically connected, and a second region A2 which is extended from the first region A1 and to which a repair micro LED 250 (refer to FIG. 11) may be electronically connected.

In the first region A1, a plurality of contact protrusions 142, 144 that the chip electrode pads 151, 153 of the micro LEDs 150 respectively contact electronically are formed to have an even arrangement. In contrast, the second region A2 constitutes an approximate plane, while the contact protrusions 142, 144 are not formed.

The plurality of contact protrusions 142, 144 are formed of approximately hemisphere shapes, and the protrusions may be evenly arranged in the first region A1 of the substrate electrode pads 141, 143.

On the inner sides of the plurality of contact protrusions 142, 144, elastic cores may be arranged, and after the micro LEDs 150 are transferred to the TFT substrate (e.g., after thermo-compression bonding among the processes for transfer), the volumes of the protrusions expand by their own elastic force, and the plurality of contact protrusions 142, 144 may adhere to the chip electrode pads 151, 153. Accordingly, connection credibility between the substrate electrode pads 141, 143 and the chip electrode pads 151, 153 may be improved.

On each of the substrate electrode pads 141, 143, connecting portions 141a, 143a electronically connected with via hole wirings 161, 163 formed on one side may be extensively formed in integration. The formed locations and the sizes (areas) of the connecting portions 141a, 143a are not limited.

In case the micro LEDs 150 arranged in the first region A1 of the substrate electrode pads 141, 143 are defective, the repair micro LED 250 may be electronically connected to the second region A2 of the substrate electrode pads 141, 143. The defective micro LEDs 150 may be maintained as they are without being separated from the substrate electrode pads 141, 143.

The substrate electrode pads 141, 143 are covered by the NCF layer 27 that was formed when manufacturing the display module 10. In this case, as in FIG. 10, a part of the NCF layer 27 corresponding to the second region A2 of the substrate electrode pads 141, 143 on which the repair micro LED 250 will be mounted is removed, and holes 27a, 27b exposing the second region A2 of the substrate electrode pads 141, 143 to the outside are formed.

Then, after applying conductive ink (e.g., Ag ink) on the second region A2 exposed through the holes 27a, 27b, the chip electrode pads 151, 153 of the repair micro LED 250 are respectively connected electronically to the second region A2 of the substrate electrode pads 141, 143 as in FIG. 11.

The second region A2 of the substrate electrode pads 141, 143 constitutes an approximate plane while a plurality of contact protrusions are not formed, and accordingly, the chip electrode pads 151, 153 of the repair micro LED 250 may be stably connected to the second region A2 of the substrate electrode pads 141, 143. In this case, the chip electrode pads 151, 153 of the repair micro LED 250 may be electronically and physically connected with the substrate electrode pads 141, 143 through the conductive ink.

Figure 12:
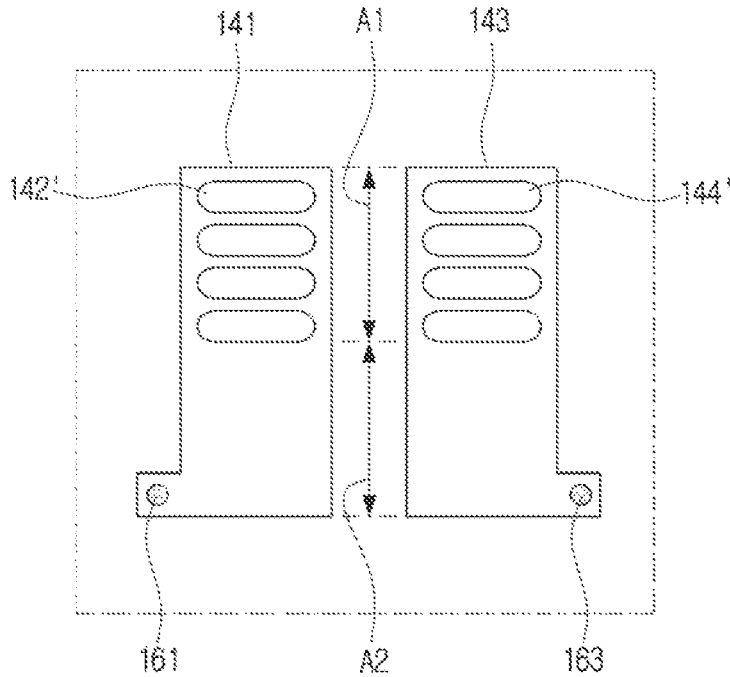
FIG. 12 is a diagram illustrating a shape of a contact protrusion formed on a substrate electrode pad having a redundancy area according to an embodiment of the disclosure.

FIG. 12 is a diagram illustrating a shape of a contact protrusion formed on a substrate electrode pad having a redundancy area according to an embodiment of the disclosure.

Referring to FIG. 12, in the substrate electrode pads 141, 143, a plurality of contact protrusions 142', 144' are formed only in the first region A1, and the second region A2 constitutes a plane.

Unlike the contact protrusions 142, 144 in hemisphere shapes illustrated in FIG. 8, the plurality of contact protrusions 142', 144' may include rectilinear shapes of which length (the horizontal direction) and width (the vertical direction) are different from each other as the contact protrusions 42', 44' illustrated in FIG. 6.

The plurality of contact protrusions 142', 144' may be arranged approximately in parallel at a specific interval. In FIG. 12, an embodiment where the length and the width of all of the plurality of contact protrusions 142', 144' were formed to be identical was illustrated, but the disclosure is not limited thereto, and the length and the width of the plurality of contact protrusions 142', 144' may be formed to be different from one another.

On the inner sides of the plurality of contact protrusions 142', 144', elastic cores may be arranged. In this case, the shapes and the material of the elastic cores may be formed to be identical or similar to those of the elastic cores 42a', 44a' illustrated in FIG. 7.

Hereinafter, a manufacturing process of a display module according to an embodiment of the disclosure will be sequentially described with reference to the drawings.

Figure 13:
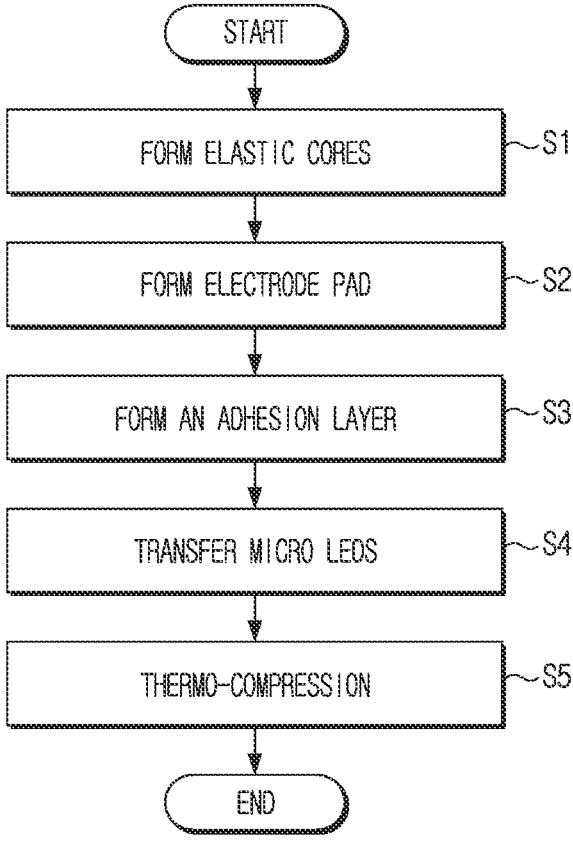
FIG. 13 is a flowchart illustrating a manufacturing process of a display module according to an embodiment of the disclosure.

FIG. 13 is a flowchart illustrating a manufacturing process of a display module according to an embodiment of the disclosure. FIGS. 14, 15, 16, 17, 18, 19, 20 and 21 are diagrams sequentially illustrating a manufacturing process of a display module according to an embodiment of the disclosure. FIG. 22 is a diagram illustrating the XXII portion of in FIG. 21 according to an embodiment of the disclosure.

Figure 14:
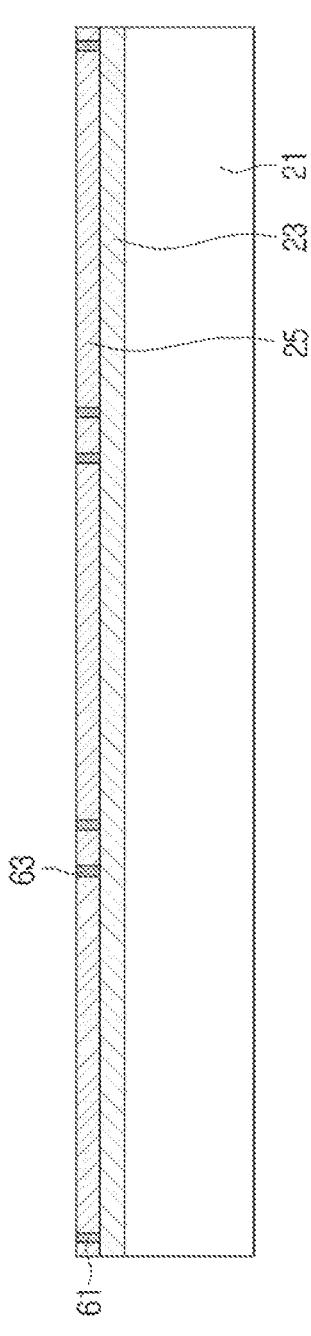
FIGS. 14, 15, 16, 17, 18, 19, 20 and 21 are diagrams sequentially illustrating a manufacturing process of a display module according to an embodiment of the disclosure.

Referring to FIG. 14, on the glass substrate 21, a TFT layer 23 and an insulating organic film 25 are sequentially formed in lamination, and after a via hole is formed on the insulating organic film 25, via hole wirings 61, 63 are formed in the via hole.

The formed locations of the via hole wirings 61, 63 may be determined as the closest locations where the via hole wirings 61, 63 may be electronically connected to the substrate electrode pads 41, 43 that will be formed in the later process.

Figure 15:
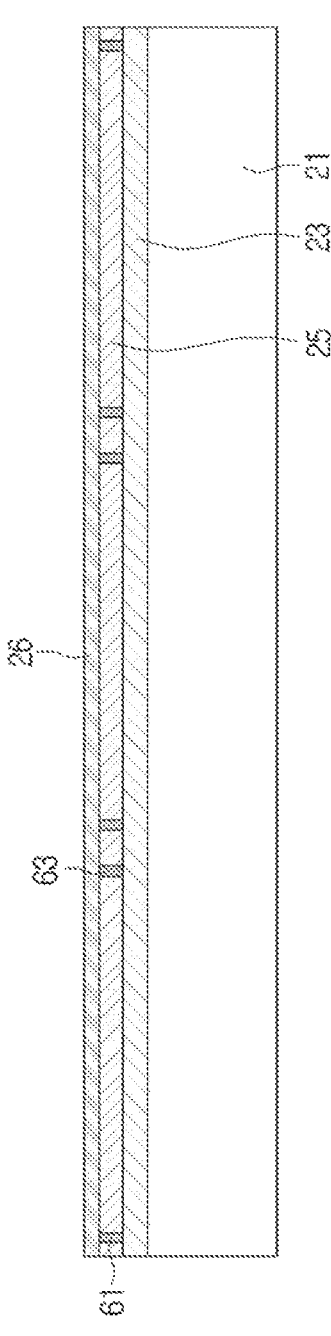

Referring to FIG. 15, an elastic layer 26 for forming elastic cores is formed on the insulating organic film 25 in lamination. The material of the elastic layer may be any one of an elastic polymer such as polyimide (PI), metal having elasticity, or metal having both elasticity and conductivity.

Figure 16:
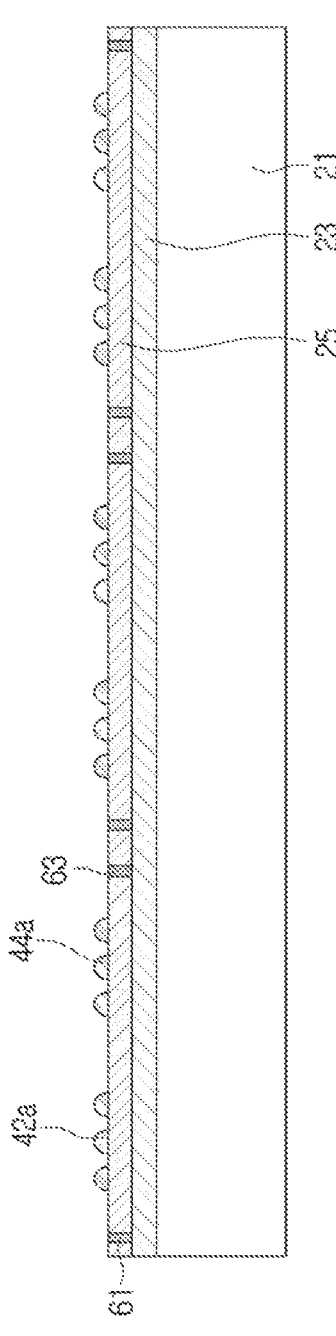

Referring to FIG. 16, in operation S1, the elastic layer 26 is patterned through a photolithography process, and a plurality of elastic cores 42a, 44a evenly arranged at a specific interval in a predetermined area are formed.

The formed locations of the plurality of elastic cores 42a, 44a may be locations that may be covered by the substrate electrode pads 41, 43 that will be formed in the later process.

Figure 17:
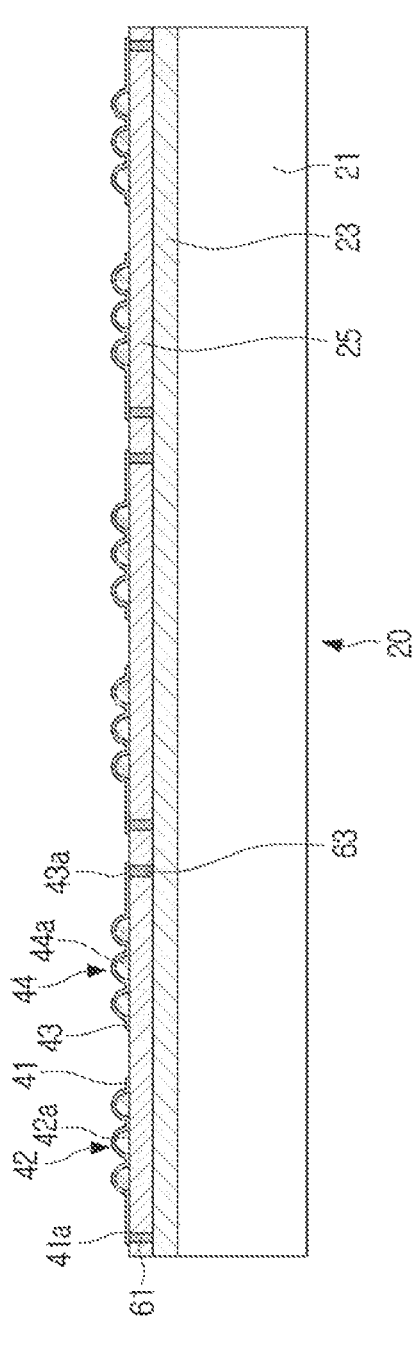

Referring to FIG. 17, in operation S2, the substrate electrode pads 41, 43 are formed in the locations where the plurality of elastic cores 42a, 44a are formed on the insulating organic film 25.

The substrate electrode pads 41, 43 may be formed through a deposition process such as sputtering after performing masking processing on the insulating organic film 25. The material constituting the substrate electrode pads 41, 43 may be Ti/Al/Ti, Mo/Al/Mo, Ni, Cu, etc.

The substrate electrode pads 41, 43 may also be formed through an imprinting process, an inkjet printing process, or a stamping process, etc.

A part of the substrate electrode pads 41, 43 formed on the insulating organic film 25 is formed to cover the plurality of elastic cores 42a, 44a. Accordingly, in the substrate electrode pads 41, 43, the part covering the plurality of elastic cores 42a, 44a may form contact protrusions 42, 44 by the shapes of the elastic cores 42a, 44a.

When the substrate electrode pads 41, 43 are formed on the insulating organic film 25, the connecting portions 41a, 43a electronically connected with the via hole wirings 61, 63 are formed integrally.

In the substrate electrode pads 41, 43, capping layers 45, 46 (refer to FIG. 5) laminated on the substrate electrode pads 41, 43 may be formed for preventing oxidation. In this case, the material of the capping layers 45, 46 may include an oxide such as Au or ITO, IZO, etc. having conductivity not only for preventing oxidation of the substrate electrode pads 41, 43, but also for being electronically connected to the chip electrode pads 51, 53.

Figure 18:
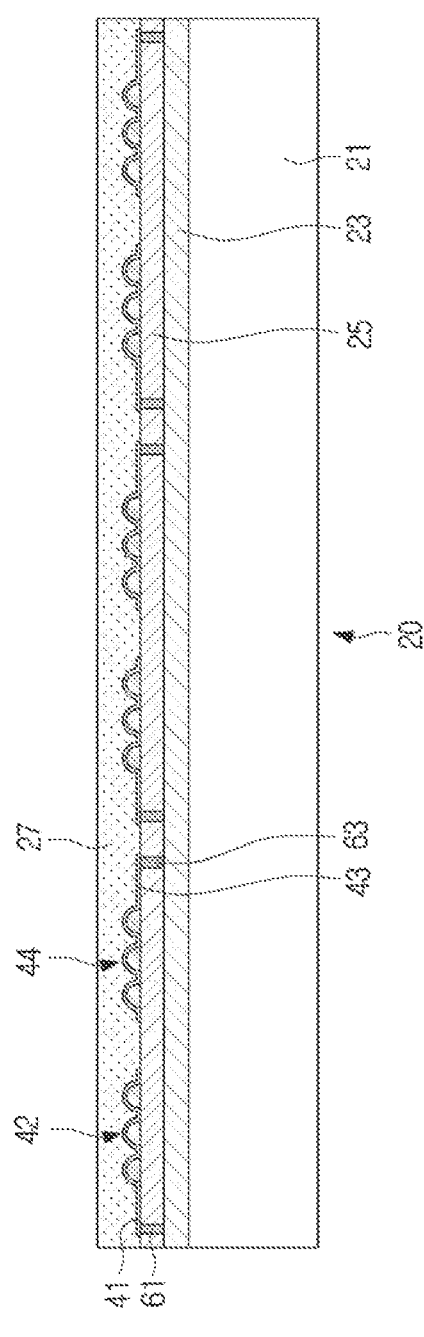

Referring to FIG. 18, in operation S3 an adhesion layer is formed by being laminated on the entire areas of the insulating organic film 25 including the substrate electrode pads 41, 43. The adhesion layer may be, for example, an NCF layer 27 using an NCF cheaper than an ACF.

Figure 19:
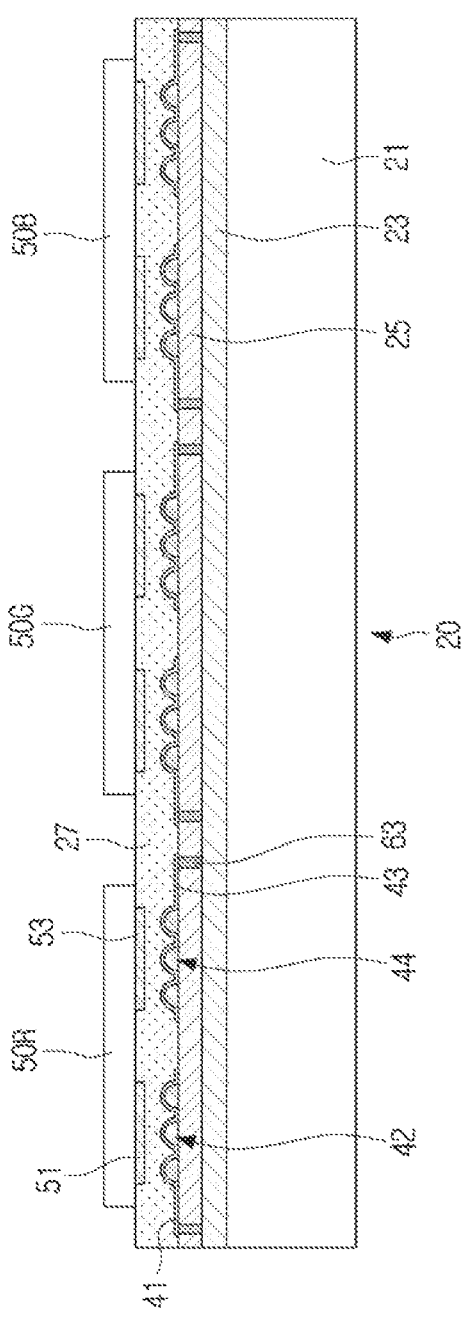

Referring to FIG. 19, in operation S4, a plurality of micro LEDs 50R, 50G, 50B are transferred to the TFT substrate 20 from an epi substrate or a relay substrate (interposer). In FIG. 19, three R/G/B micro LEDs 50R, 50G, 50B constituting one pixel are shown.

In each of the plurality of micro LEDs 50R, 50G, 50B transferred to the TFT substrate 20, the chip electrode pads 51, 53 contact the NCF layer 27. The plurality of micro LEDs 50R, 50G, 50B may be flip-type micro LEDs of which light emitting surfaces are located on the opposite side of the chip electrode pads 51, 53.

Figure 20:
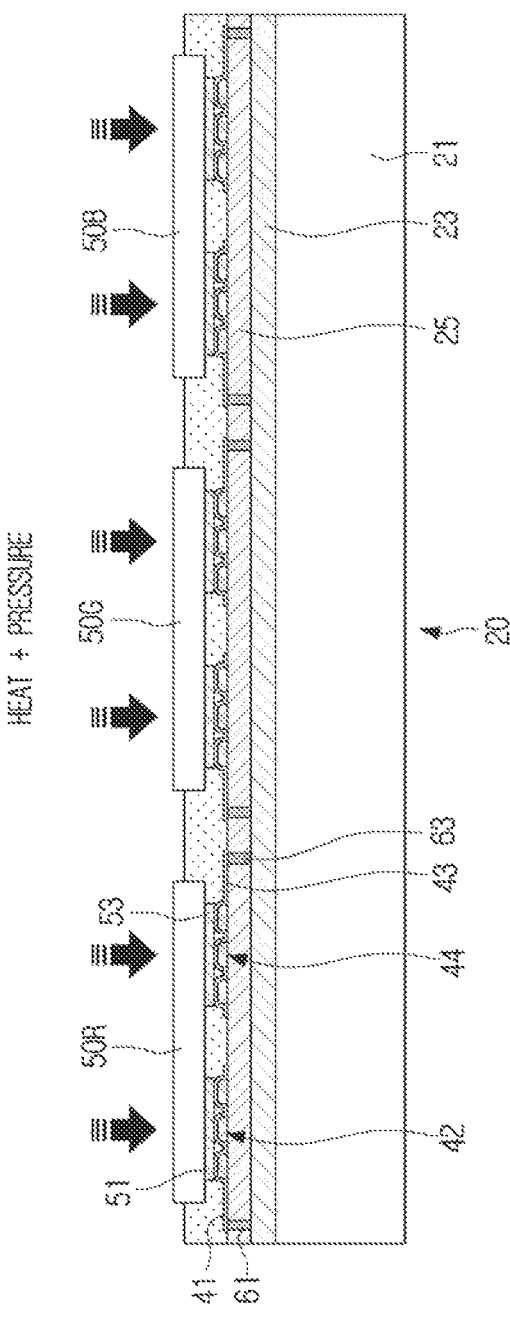

Referring to FIG. 20, in operation S5, the plurality of micro LEDs 50R, 50G, 50B are thermo-compressed to the side of the TFT substrate 20 by using a predetermined pressurizing member.

The thermo-compression bonding is a process of pressurizing the plurality of micro LEDs 50R, 50G, 50B to the side of the TFT substrate 20 by a pressurizing member while the TFT substrate 20 has been heated to a specific temperature by a heater.

The plurality of micro LEDs 50R, 50G, 50B are forcibly inserted inside the NCF layer 27 laminated on the insulating organic film 25 by the pressure of the pressurizing member.

In this case, each chip electrode pad 51, 53 of the plurality of micro LEDs 50R, 50G, 50B contacts the corresponding substrate electrode pads 41, 43, and a part of the surface where they contact each other melts by heat and pressure. Accordingly, physical connection with each other may be made.

Also, in the thermo-compression bonding, the plurality of contact protrusions 42, 44 of the substrate electrode pads 41, 43 may be pushed by the pressure of the pressurizing member, and their shapes may be deformed.

Figure 21:
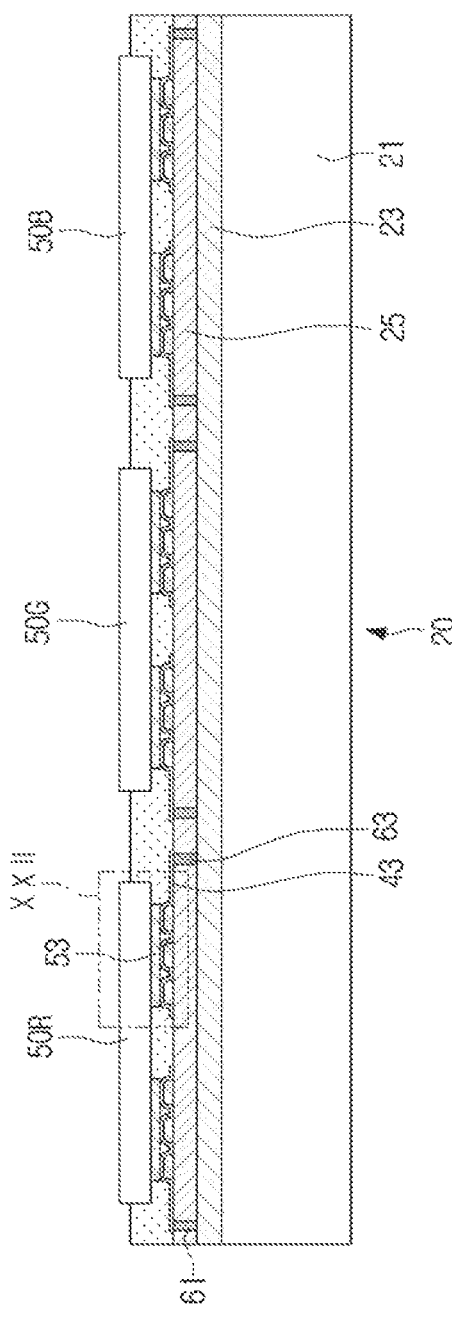
Figure 22:
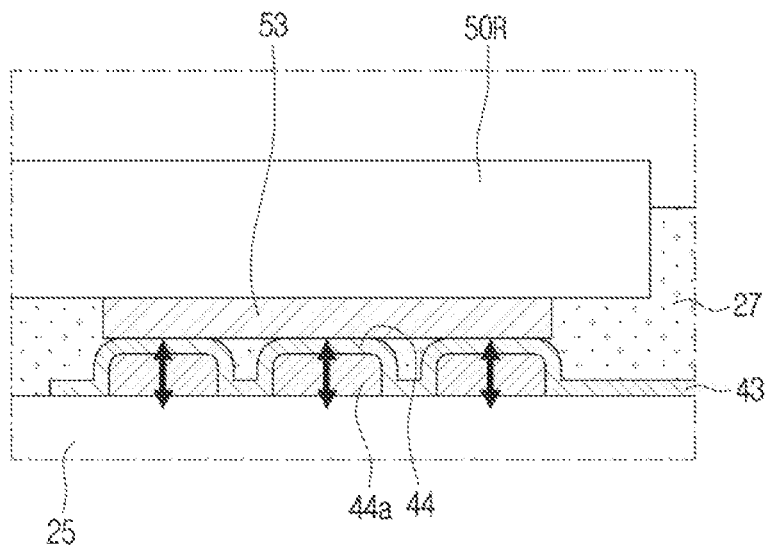
FIG. 22 is a diagram illustrating the XXII portion of in FIG. 21 according to an embodiment of the disclosure.

Referring to FIG. 21, after the thermo-compression bonding, the NCF layer 27 is cured, and the plurality of micro LEDs 50R, 50G, 50B may be steadfastly fixed to the TFT substrate 20.

Referring to FIG. 22, when the pressure by the pressurizing member is released, the elastic cores 42a, 44a inside each contact protrusion 42, 44 are restored to their original shapes by their own elastic force, and a part of the substrate electrode pads 41, 43 laminated on the elastic cores 42a, 44a adheres to the chip electrode pads 51, 53. Accordingly, electronic connection between each electrode pad 41, 43; 51, 53 may be performed securely.

Figure 23:
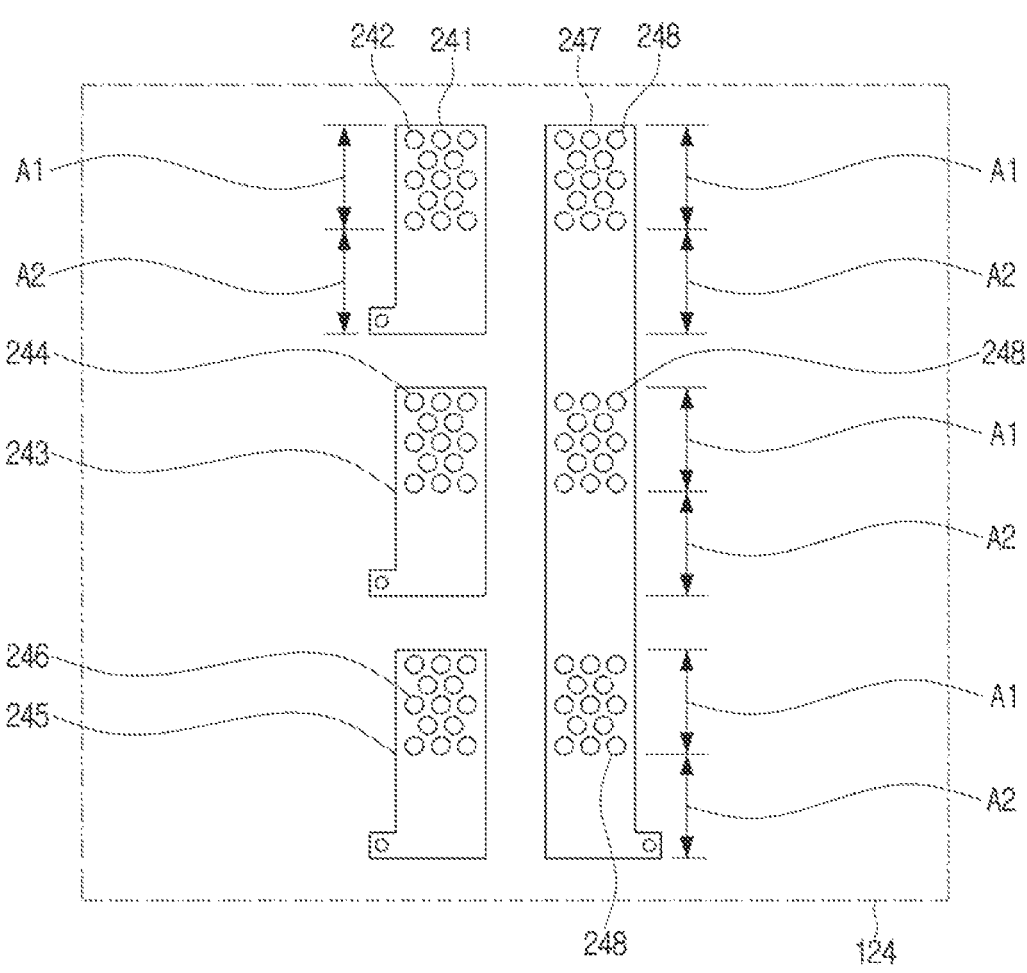
FIG. 23 is a diagram illustrating a substrate electrode pad having a redundancy area to which a repair micro LED may electronically connect according to an embodiment of the disclosure.
Figure 24:
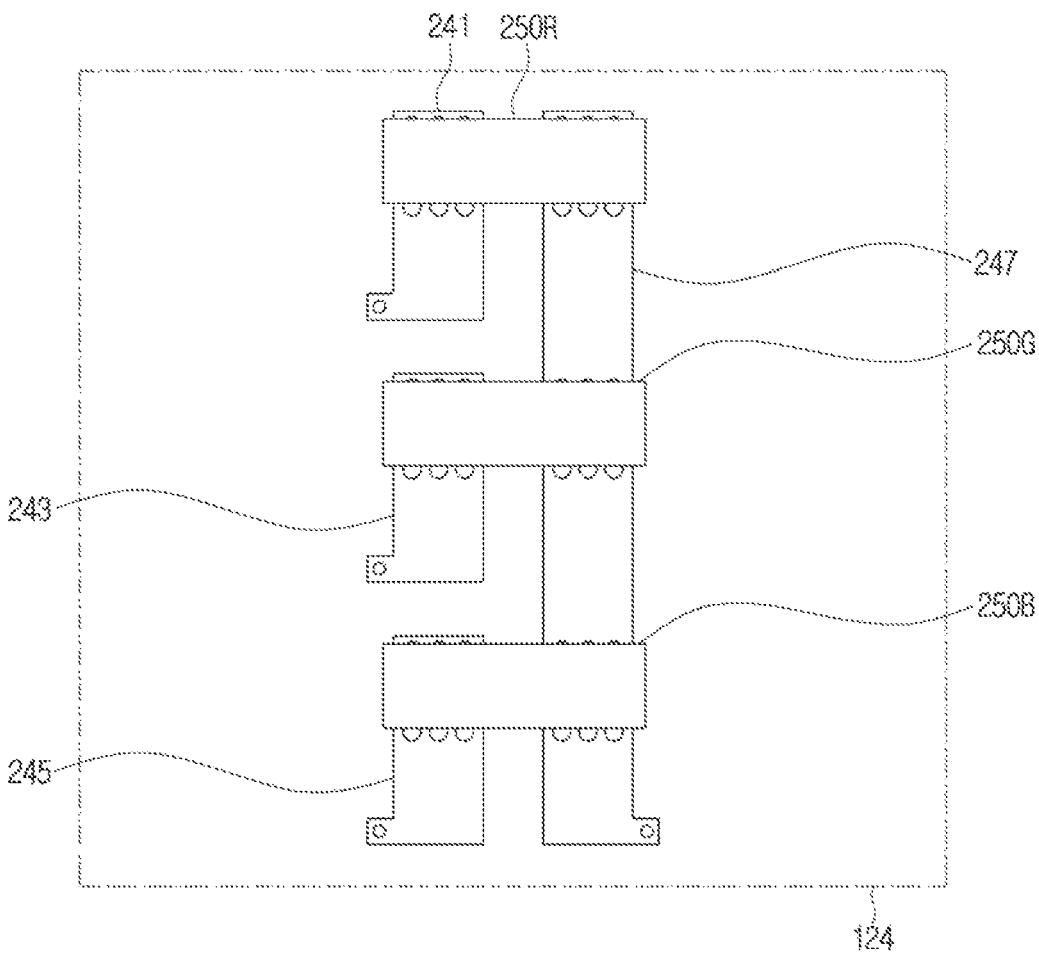
FIG. 24 is a diagram illustrating micro LEDs arranged in the main area of the substrate electrode pad illustrated in FIG. 23 according to an embodiment of the disclosure.

FIG. 23 is a diagram illustrating a substrate electrode pad having a redundancy area to which a repair micro LED may electronically connect according to an embodiment of the disclosure. FIG. 24 is a diagram illustrating micro LEDs arranged in the main area of the substrate electrode pad illustrated in FIG. 23 according to an embodiment of the disclosure.

Referring to FIG. 23 and FIG. 24, in case three sub-pixels (red, green, and blue micro LEDs 250R, 250G, 250B) are arranged for each pixel 124, the display module according to an embodiment may include three first to third substrate electrode pads 241, 243, 245 connected to three power electrodes, and one fourth substrate electrode pad 247 connected to one common electrode.

The first to third substrate electrode pads 241, 243, 245 may be arranged in parallel at a specific interval along the longitudinal direction of the fourth substrate electrode pad 247.

The first to third substrate electrode pads 241, 243, 245 may respectively include a first region A1 where a plurality of contact protrusions 242, 244, 246 are formed, and a second region A2 which is a plane and where a plurality of contact protrusions are not formed.

The fourth substrate electrode pad 247 may include a plurality of first regions A1 where a plurality of contact protrusions 248 are formed, and a plurality of second regions A2 which are planes and where a plurality of contact protrusions are not formed. The plurality of first regions A1 of the fourth substrate electrode pad 247 may respectively be arranged in locations corresponding to the first regions A1 of the first to third substrate electrode pads 241, 243, 245. Also, the plurality of second regions A2 of the fourth substrate electrode pad 247 may respectively be arranged in locations corresponding to the second regions A2 of the first to third substrate electrode pads 241, 243, 245. Accordingly, the first regions A1 and the second regions A2 of the fourth substrate electrode pad 247 may be alternatingly arranged repeatedly along the longitudinal direction of the fourth substrate electrode pad 247.

In this case, if an error occurs in at least one of the previously mounted sub-pixels (the red, green, and blue micro LEDs 250R, 250G, 250B), a pair of chip electrode pads of a repair micro LED may be electronically and physically connected to the second regions A2 of each substrate electrode pad 241, 243, 245, 247 and used.

Example embodiments provide a display module including substrate electrode pads that may stabilize connection between the substrate electrode pads and chip electrode pads of micro LEDs, and a method for manufacturing the same.

While the various embodiments of the disclosure have been described separately from one another, the embodiments do not have to be implemented independently, but the configuration and operation of each embodiment may be implemented in combination with at least one other embodiment.

Also, while example embodiments of the disclosure have been shown and described, the disclosure is not limited to the aforementioned specific embodiments, and it is apparent that various modifications may be made by those having ordinary skill in the art to which the disclosure belongs, without departing from the gist of the disclosure as claimed by the appended claims. Further, it is intended that such modifications are not to be interpreted independently from the technical idea or prospect of the disclosure.

What is claimed is:

1. A display module comprising:
a substrate;
a plurality of substrate electrode pads provided on the substrate; and
a plurality of micro light-emitting diodes (LEDs) connected to the plurality of substrate electrode pads,
wherein each of the plurality of substrate electrode pads comprises:
a first region in which a plurality of contact protrusions are formed, and
a second region configured to be connected to a repair micro LED,
wherein the display module further comprises a capping layer provided on and covering each substrate electrode pad of the plurality of substrate electrode pads and configured to prevent oxidation of the plurality of substrate electrode pads, and
wherein each of the plurality of substrate electrode pads cover respective pluralities of contact protrusions in respective first regions.

2. The display module of claim 1, wherein the plurality of substrate electrode pads comprises at least four substrate electrode pads, and
wherein the at least four substrate electrode pads comprise:
a first substrate electrode pad, a second substrate electrode pad, and a third substrate electrode pad that are connected to a power electrode; and
a fourth substrate electrode pad connected to a common electrode.

3. The display module of claim 2, wherein the first region of the fourth substrate electrode pad and the second region of the fourth substrate electrode pad are alternatingly arranged.

4. The display module of claim 1, wherein each of the plurality of micro LEDs comprises a pair of LED electrode pads, and
wherein each micro LED of the plurality of micro LEDs respectively corresponds to a pair of substrate electrode pads of the plurality of substrate electrode pads.

5. The display module of claim 1, wherein the plurality of contact protrusions are evenly distributed inside the first region.

6. The display module of claim 1, wherein an elastic core is provided on inner sides of the plurality of contact protrusions.

7. The display module of claim 6, wherein the elastic core comprises a conductive material or a non-conductive material.

8. The display module of claim 1, wherein the plurality of contact protrusions have hemisphere shapes, tetrahedrons, circular columns, or oval column shapes.

9. The display module of claim 1, wherein the plurality of contact protrusions have rectilinear shapes with a specific length, and
wherein the plurality of contact protrusions are arranged in parallel at a predetermined interval.

10. The display module of claim 1, wherein the plurality of substrate electrode pads comprises at least one of Ti/Al/Ti, Mo/Al/Mo, Cu/Ni/Au, Ni, Cu, or Indium.

11. The display module of claim 1,

wherein the capping layer comprises at least one of Au, Indium Tin Oxide (ITO), Indium Zinc Oxide (IZO), or Indium.

12. The display module of claim 1, wherein a surface of the second region comprises a plane.

13. The display module of claim 1, wherein a pair of chip electrode pads is respectively connected to a pair of corresponding substrate electrode pads, and wherein each chip electrode pad comprises at least one of Ni/Au, Ti/Au, or Cu(Ni) Pillar/SnAg Bump.

\* \* \* \* \*